United States Patent
Chen et al.

(10) Patent No.: US 12,225,729 B2
(45) Date of Patent: Feb. 11, 2025

(54) SONOS MEMORY CELL STRUCTURE AND FABRICATING METHOD OF THE SAME

(71) Applicant: UNITED MICROELECTRONICS CORP., Hsin-Chu (TW)

(72) Inventors: Yung-Ting Chen, Hsinchu County (TW); Hsueh-Chun Hsiao, Hsinchu County (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 18/608,878

(22) Filed: Mar. 18, 2024

(65) Prior Publication Data
US 2024/0224529 A1 Jul. 4, 2024

Related U.S. Application Data

(62) Division of application No. 17/722,403, filed on Apr. 18, 2022, now Pat. No. 12,096,635.

(30) Foreign Application Priority Data

Mar. 24, 2022 (CN) .......................... 202210298364.7

(51) Int. Cl.
| | |
|---|---|
| *H10B 43/30* | (2023.01) |
| *H01L 21/28* | (2006.01) |
| *H01L 29/423* | (2006.01) |
| *H01L 29/66* | (2006.01) |
| *H01L 29/792* | (2006.01) |

(52) U.S. Cl.
CPC ........ *H10B 43/30* (2023.02); *H01L 29/40117* (2019.08); *H01L 29/4234* (2013.01); *H01L 29/66833* (2013.01); *H01L 29/792* (2013.01)

(58) Field of Classification Search
CPC ............. H01L 33/005; H01L 29/40117; H01L 29/4234; H01L 29/66833; H01L 29/792
See application file for complete search history.

(56) References Cited

U.S. PATENT DOCUMENTS

| | | | | |
|---|---|---|---|---|
| 2002/0197800 | A1* | 12/2002 | Hashimoto | ..... H01L 21/823462 |
| | | | | 438/266 |
| 2017/0084622 | A1 | 3/2017 | Hsu | |

FOREIGN PATENT DOCUMENTS

| | | |
|---|---|---|
| CN | 104425500 A | 3/2015 |
| KR | 100594325 B1 * | 6/2006 |

* cited by examiner

*Primary Examiner* — Mohammad M Choudhry
(74) *Attorney, Agent, or Firm* — Winston Hsu

(57) ABSTRACT

An SONOS memory cell includes a silicon substrate. A tunnel silicon oxide layer, a silicon nitride layer and a silicon oxide layer are disposed from bottom to top on the silicon substrate. The silicon oxide layer includes two first silicon oxide layers and a second silicon oxide layer. A thickness of the silicon oxide layer is smaller than a thickness of each of the first silicon oxide layers. A control gate covers and contacts the silicon oxide layer. A first source/drain doping region and a second source/drain doping region are respectively disposed at two sides of the control gate. The silicon oxide layer has a cross section. The second silicon oxide layer is sandwiched between the two first silicon oxide layers on the cross section.

8 Claims, 5 Drawing Sheets

SONOS MEMORY CELL STRUCTURE AND FABRICATING METHOD OF THE SAME

CROSS REFERENCE TO RELATED APPLICATIONS

This application is a division of U.S. application Ser. No. 17/722,403, filed on Apr. 18, 2022. The content of the application is incorporated herein by reference.

BACKGROUND OF THE INVENTION

1. Field of the Invention

The present invention relates to a silicon-oxide-nitride-oxide-silicon (SONOS) memory cell and a method of fabricating the same, and more particularly to an SONOS memory cell with a topmost silicon oxide layer which has an inconsistent thickness.

2. Description of the Prior Art

Electronically erasable rewritable memory (EEPROM) and flash memory are widely used in electronic products. Flash memory is a storage unit with an array that can be independently programmed and read. By using a sense amplifier, data stored in a flash memory can be read, and the data can be determined by detecting the current flowing through the flash memory. As the size of integrated circuits shrinks, memories stored in charge trapping dielectric layers are developed, such as SONOS memory. An SONOS memory stores information by storing charges in silicon nitride. When the charge is stored in silicon nitride, the threshold voltage of the SONOS memory increases, and when the charge is released, the threshold voltage of the SONOS memory decreases.

However, during the manufacturing process of SONOS memory, a height difference occurs between a shallow trench isolation and a silicon substrate; therefore the subsequently formed silicon nitride will have another height difference due to a height difference between the shallow trench isolation and the silicon substrate. As a result, when charges are stored in the silicon nitride, current leakage will generate because of the height difference of the silicon nitride.

SUMMARY OF THE INVENTION

In view of this, an SONOS memory cell is provided in the present invention. The topmost silicon oxide in the SONOS memory cell is changed to become thin at the middle and thick at both sides. In this way, current leakage can be prevented.

According to a preferred embodiment of the present invention, an SONOS memory cell structure includes an SONOS memory cell, wherein the SONOS memory cell includes a silicon substrate. Two shallow trench isolations are disposed within the silicon substrate, wherein the silicon substrate between the two shallow trench isolations is defined as an active region. A tunnel silicon oxide layer, a silicon nitride layer and a silicon oxide layer are disposed from bottom to top on the silicon substrate, wherein the tunnel silicon oxide layer contacts the silicon substrate, the silicon oxide layer includes two first silicon oxide layer and a second silicon oxide layer, a thickness of the second silicon oxide layer is smaller than a thickness of each of the two first silicon oxide layers. A control gate covers and contacts the silicon oxide layer. A first source/drain doping region and a second source/drain doping region are respectively disposed at two sides of the control gate and in the active region. A first direction points from the first source/drain doping region to the second source/drain doping region. A second direction is parallel to a top surface of the silicon substrate and perpendicular to the first direction. Along the second direction, the silicon oxide layer has a cross section, and the cross section shows that the second silicon oxide layer is sandwiched between the two first silicon oxide layers.

According to another preferred embodiment of the present invention, a fabricating method of an SONOS memory cell structure includes providing a silicon substrate, wherein the silicon substrate is divided into a memory unit region, an input output region and a high voltage transistor region. Next, a tunnel silicon oxide layer and a silicon nitride layer are formed to cover the memory unit region. Thereafter, a first silicon oxide layer is formed to cover and contact the silicon nitride layer, the input output region and the high voltage transistor region. Later, the first silicon oxide layer within the input output region is removed entirely and part of the first silicon oxide layer within the memory unit region is removed to segment the first silicon oxide layer within the memory unit region into two third silicon oxide layers. Subsequently, two second silicon oxide layers are formed, wherein one of the two second silicon oxide layers is between the two third silicon oxide layers and another one of the two second silicon oxide layers is within the input output region. Finally, a control gate is formed to cover the one of the two second silicon oxide layers within the memory unit region and cover the two third silicon oxide layers, a high voltage gate is formed to cover the first silicon oxide layer within the high voltage transistor region, and a transistor gate is formed to cover the another one of the two second silicon oxide layers within the input output region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of an SONOS memory cell structure according to a preferred embodiment of the present invention, wherein:

FIG. 1 depicts a substrate with a memory unit region, an input output region and a high voltage transistor region;
FIG. 2 continues from FIG. 1;
FIG. 3 continues from FIG. 2;
FIG. 4 continues from FIG. 3;
FIG. 5 continues from FIG. 4;
FIG. 6 continues from FIG. 5;
FIG. 7 continues from FIG. 6;
and
FIG. 8 continues from FIG. 7.

DETAILED DESCRIPTION

FIG. 1 to FIG. 8 depict a fabricating method of a silicon-oxide-nitride-oxide-silicon (SONOS) memory cell structure according to a preferred embodiment of the present invention.

Figure 1:
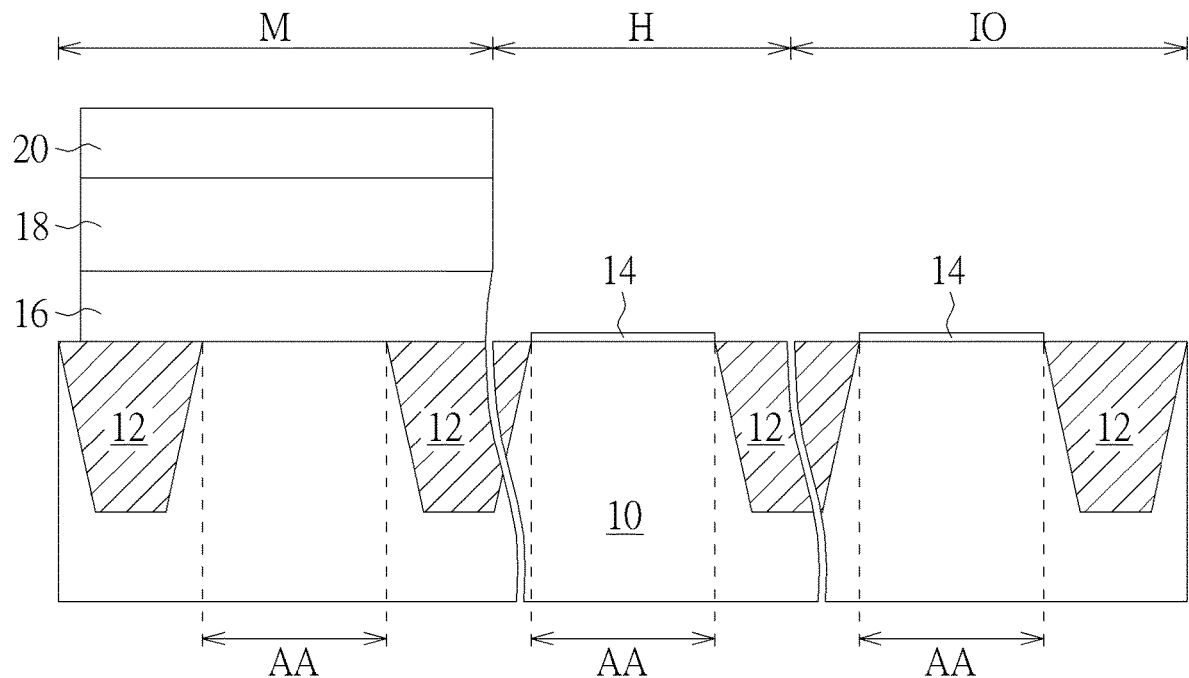
Figure 2:
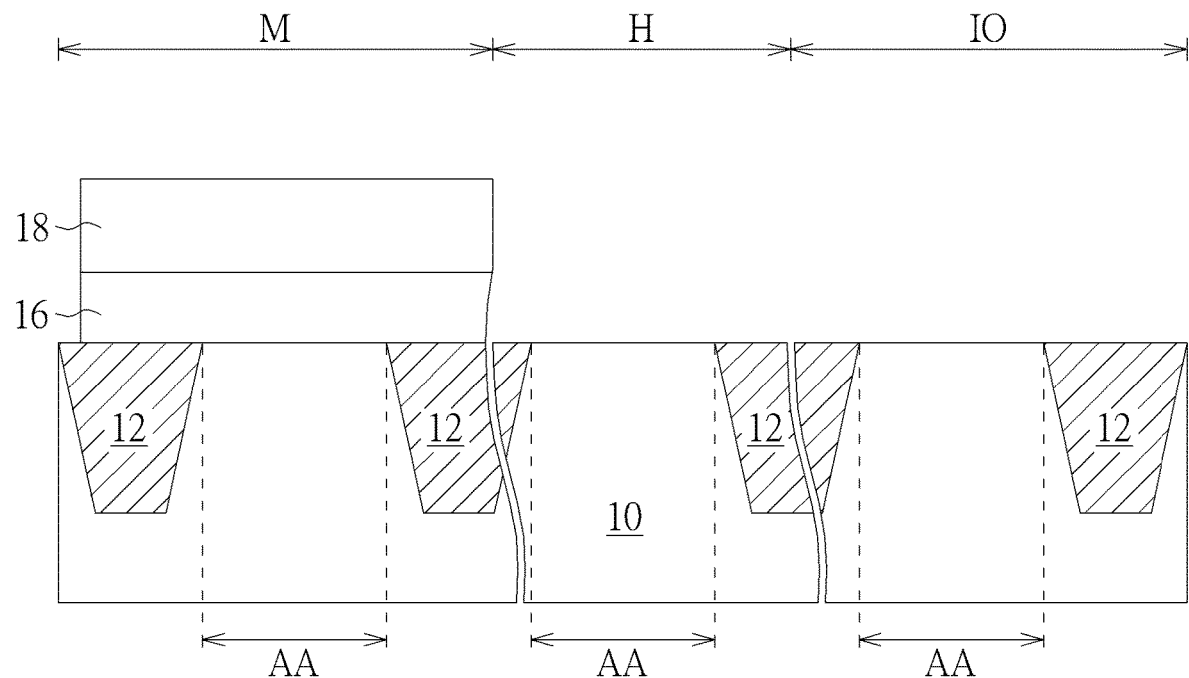

As shown in FIG. 1, a silicon substrate 10 is provided. The silicon substrate 10 is divided into a memory unit region M, an input output region IO and a high voltage transistor region H. Numerous shallow trench isolations 12 are disposed within the silicon substrate 10. The silicon substrate 10 between the adjacent shallow trench isolations 12 is defined as an active region AA. Two pad oxide layers 14 respectively cover the input output region IO and the high voltage transistor region H. The Pad oxide layers 14 serve as mask layers used to define the positions of each of the shallow trench isolations 12. Later, an oxide-nitride-oxide (ONO) stacked layer is formed, and the ONO stacked layer is patterned to form a tunnel silicon oxide layer 16, a silicon nitride layer 18 and a top silicon oxide layer 20 cover the memory unit region M. The tunnel silicon oxide layer 16 contacts the memory unit region M. Next, as shown in FIG. 2, the top silicon oxide layer 20 and the two pad oxide layers 14 are removed entirely at the same time to expose the silicon nitride layer 18, the input output region IO and the high voltage transistor region H.

Figure 3:
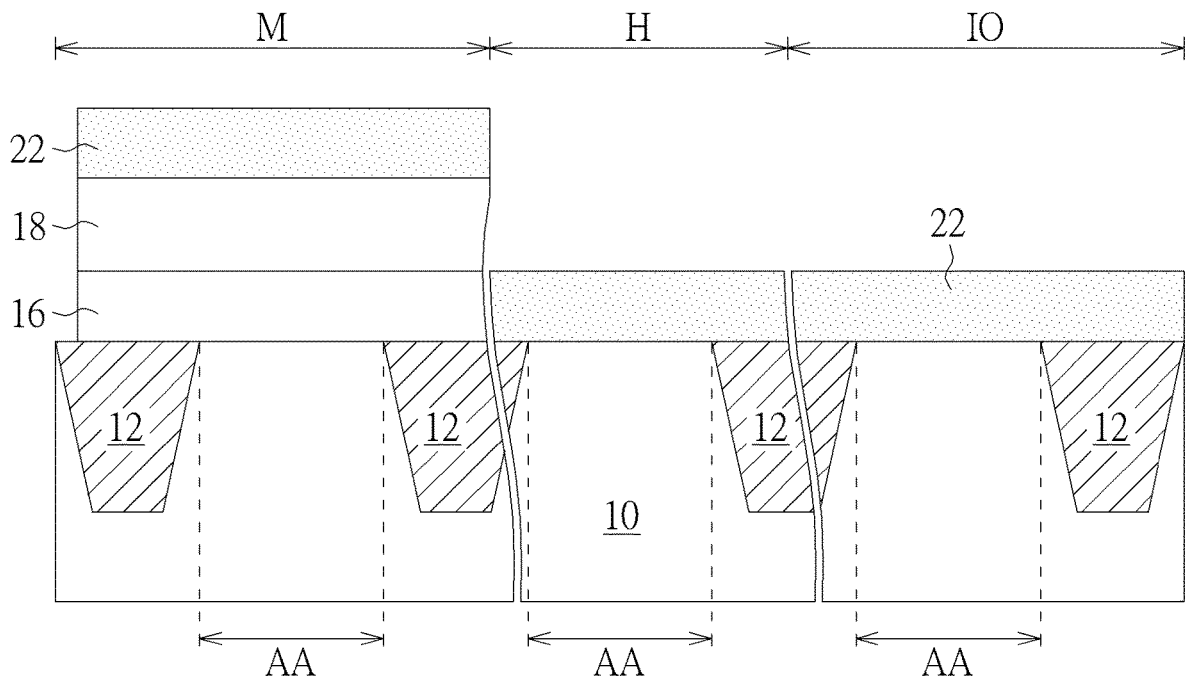

Then, a gate dielectric layer for a high voltage transistor is formed within the high voltage transistor region H. As shown in FIG. 3, a first silicon oxide layer 22 is formed to cover and contact the silicon nitride layer 18, the input output region IO and the high voltage transistor region H. The first silicon oxide layer 22 can be formed by an in-situ steam generated process or an atomic layer deposition process. For example, an in-situ steam generated process can be performed first to form a first silicon nitride layer 22 to a predetermined thickness on silicon nitride layer 18, the input output region IO and the high voltage transistor region H. Later, an atomic layer deposition process can be performed to increase the thickness of the first silicon nitride layer 22 to complete the first silicon nitride layer 22. Because the first silicon oxide layer 22 within the high voltage transistor region H will serve as a high voltage gate dielectric layer, a greater thickness is needed. The first silicon oxide layer 22 can't reach an expected thickness only by the in-situ steam generated process; therefore the atomic layer deposition process is used to help to generate enough thickness.

Figure 4:
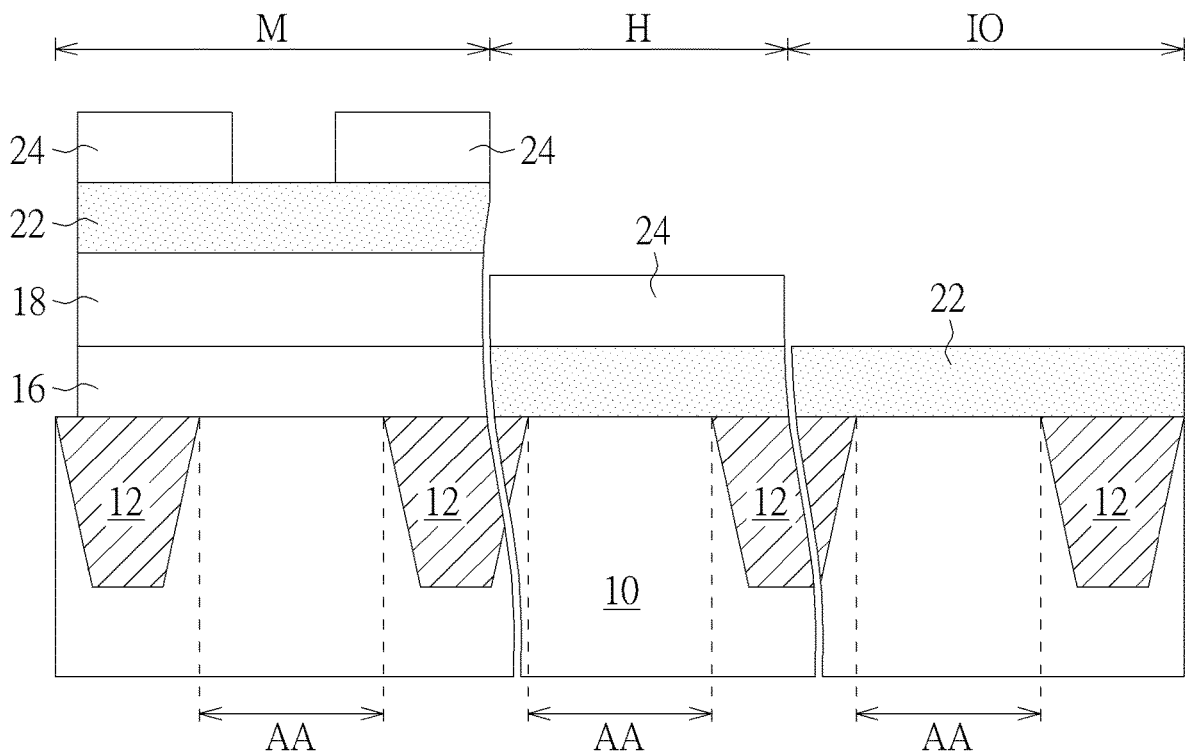
Figure 5:
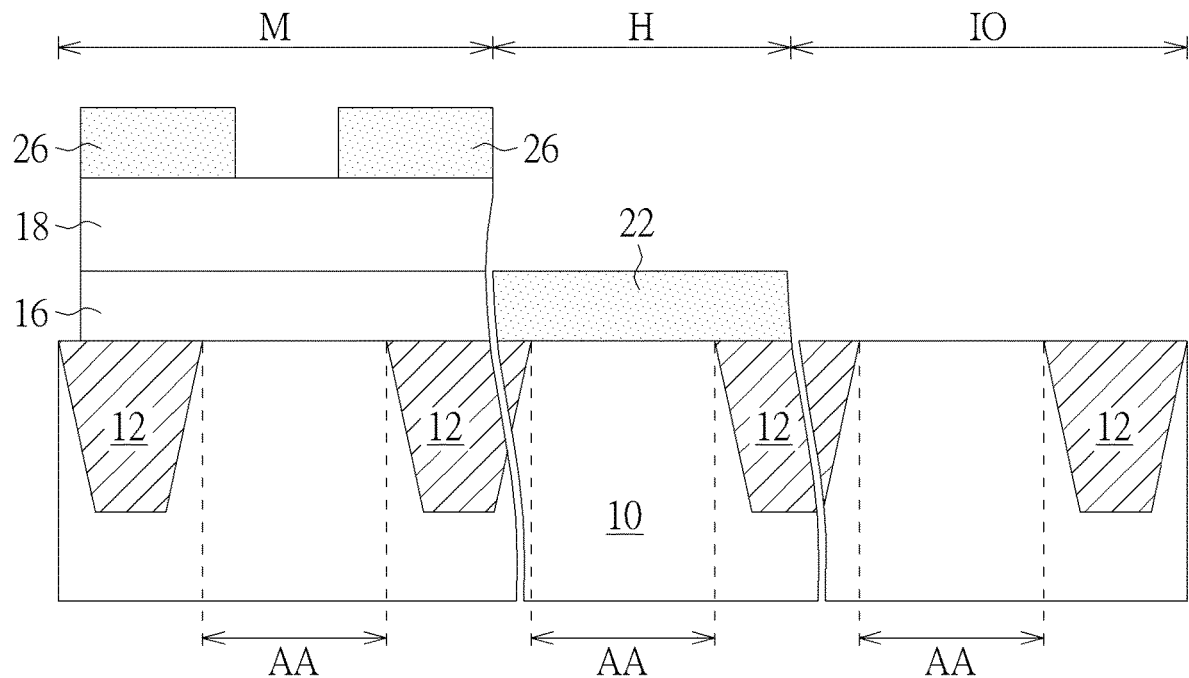

As shown FIG. 4, a deposition process and an etching process are performed to form three mask layers 24. One of the three mask layers 24 covers the first silicon oxide layer 22 within the high voltage transistor region H. The other two of the three mask layers 24 cover the first silicon oxide layer 22 within the memory unit region M. The three mask layers 24 expose the middle of the first silicon oxide layer 22 within the memory unit region M and the first silicon oxide layer 22 within the input output region IO. As shown in FIG. 5, the first silicon nitride layer 22 is etched by taking the three mask layers 24 as a mask to entirely remove the first silicon nitride layer 22 within the input output region IO and partly remove the first silicon nitride layer 22 within the memory unit region M so as to make the first silicon nitride layer 22 remaining within the memory unit region M to be segmented into two third silicon nitride layers 26. After that, the three mask layers 24 are all removed.

Figure 6:
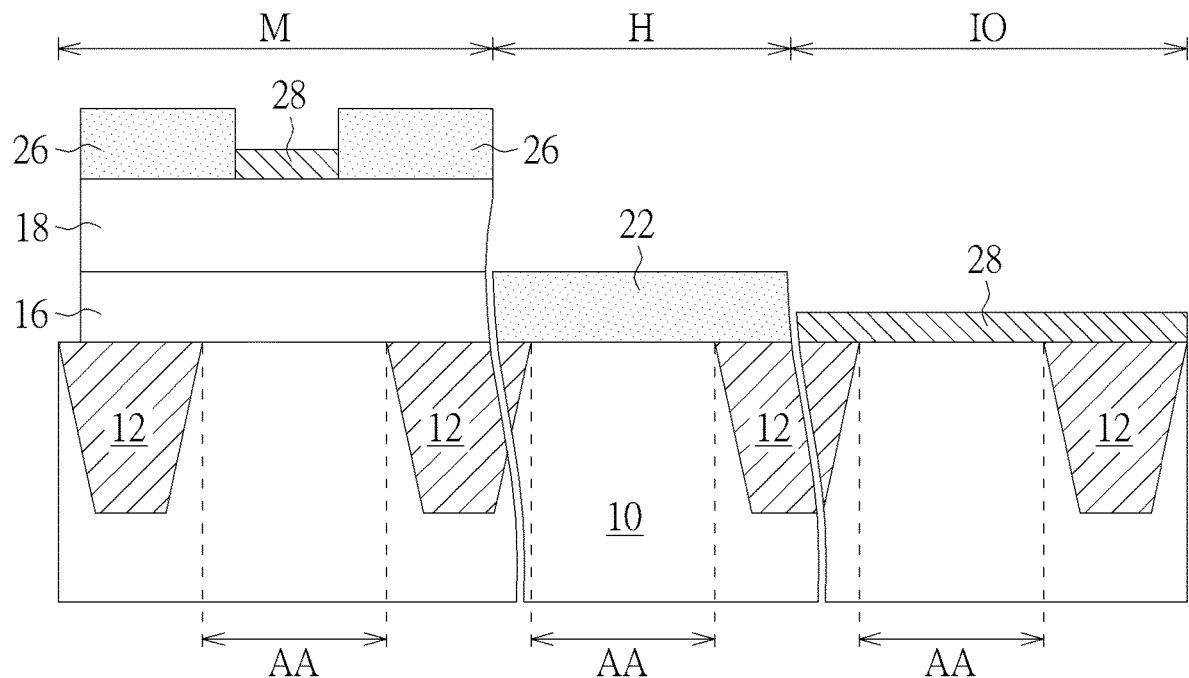

Next, a gate dielectric layer for an input output transistor is formed within the input output region IO. As shown in FIG. 6, two second silicon oxide layers 28 are formed. One of the second silicon oxide layers 28 is between the two third silicon oxide layers 26 and another one of the second silicon oxide layers 28 is within the input output region IO. In this way, the top silicon oxide layer of the ONO stacked layer form an U-shaped structure. The second silicon oxide layer 28 within the memory unit region M contacts the silicon nitride layer 18. The second silicon oxide layer 28 within the input output region IO contact the silicon substrate 10. The second silicon oxide layer 28 may be formed by an in-situ steam generated process or an atomic layer deposition process. Because the thickness of the second silicon oxide layer 28 is thin, the second silicon oxide layer 28 can be formed completely by an in-situ steam generated process. According to different embodiment, if the thickness of the second silicon oxide layer 28 is thicker, the second silicon oxide layer 28 can be formed by an in-situ steam generated process followed by an atomic layer deposition process.

Figure 7:
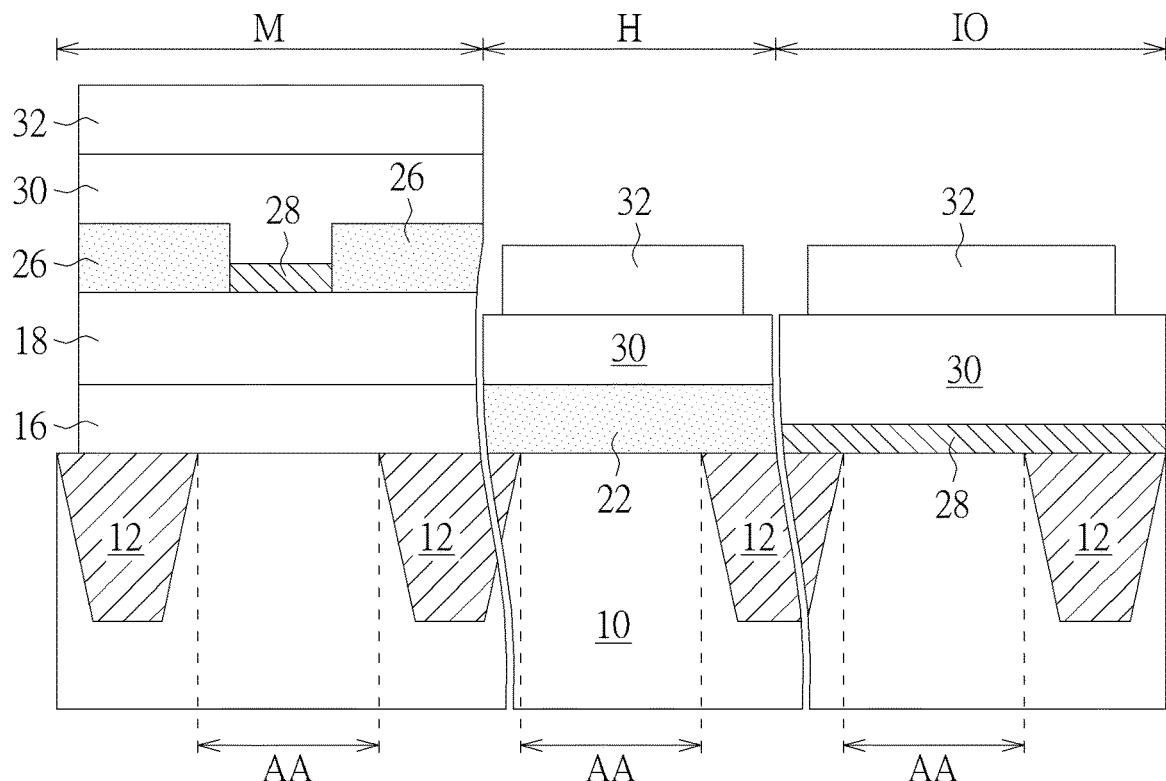
Figure 8:
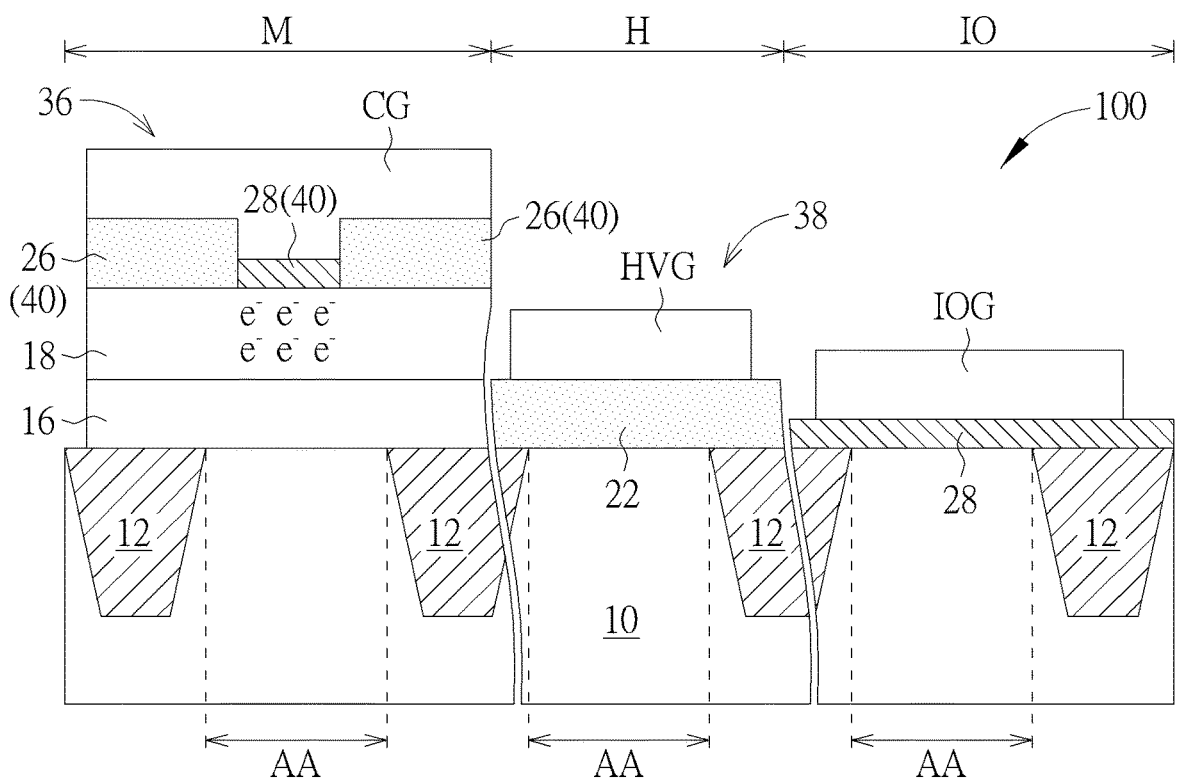

As shown in FIG. 7, a conductive layer 30 is formed to cover the first silicon oxide layer 22, the second silicon oxide layer 28 and the third silicon oxide layer 26 blanketly. The conductive layer 30 includes doped polysilicon, metal or metal compound. Later, three mask layers 32 are formed to cover the memory unit region M, the high voltage transistor region H and the input output region IO to define positions of gates in different regions. The three mask layers 32 do not connect to each other. As shown in FIG. 7 and FIG. 8, the conductive layer 30 is etched by taking the three mask layers 32 as masks and taking the first silicon oxide layer 22 and the second silicon oxide layer 28 as etching stop layers to make the conductive layer 30 segmented into a control gate CG, a high voltage gate HVG and a transistor gate IOG. In the memory unit region M, the control gate CG covers the second silicon oxide layer 28 with a thinner thickness and covers two third silicon nitride layers 26 with thicker thickness. The high voltage gate HVG covers the first silicon nitride layer 22 within the high voltage transistor region H. The transistor gate IOG covers the second silicon nitride layer 28 within the high voltage transistor region H. Later, a first source/drain doping region 34a and a second source/drain doping region 34b (please refer to FIG. 9) are respectively disposed at two sides of the control gate CG and in the silicon substrate 10. Source/drain doping regions (not shown) are respectively formed in the silicon substrate 10 at two sides of the high voltage gate HG and at two sides of the transistor gate IOG. Now an SONOS memory structure 100 is completed.

Figure 9:
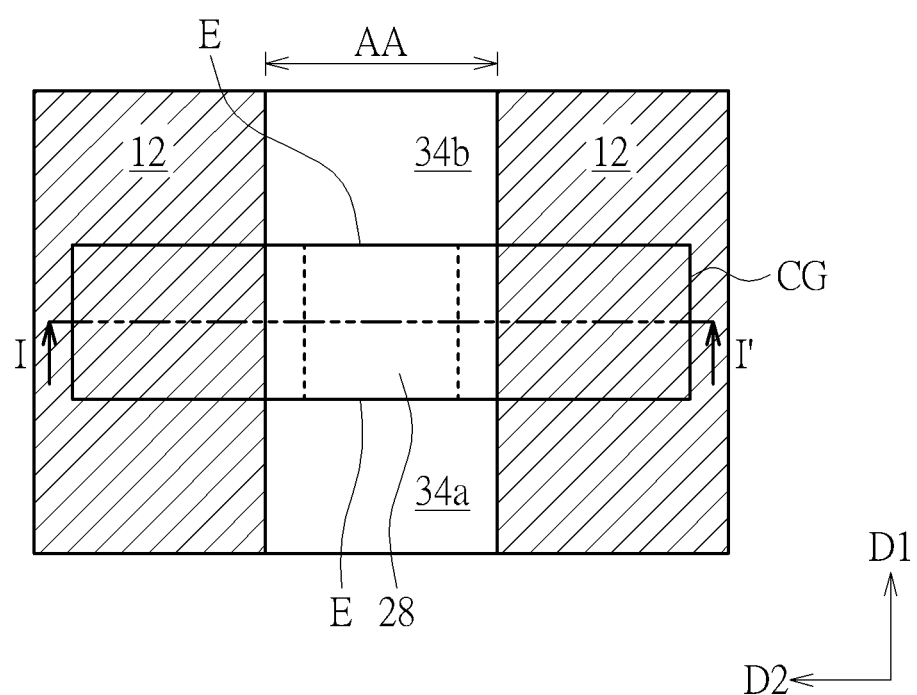
FIG. 9 depicts a top view of a SONOS memory structure in FIG. 8.

FIG. 8 depicts an SONOS memory structure according to a preferred embodiment of the present invention. FIG. 9 depicts a top view of the SONOS memory structure in FIG. 8.

Please refer to FIG. 8 and FIG. 9, an SONOS memory structure 100 includes a SONOS memory cell 36, a transistor gate IOG and a high voltage transistor 38. The SONOS memory cell 36 includes a silicon substrate 10. The silicon substrate 10 is divided into a memory unit region M, an input output region IO and a high voltage transistor region H. Numerous shallow trench isolations 12 are disposed within the silicon substrate 10. The silicon substrate 10 between the adjacent shallow trench isolations 12 is defined as an active region AA. A tunnel silicon oxide layer 16, a silicon nitride layer 18 and a silicon oxide layer 40 are disposed from bottom to top on the silicon substrate 10 within the memory unit region M. The tunnel silicon oxide layer 16 contacts the silicon substrate 10. The silicon oxide layer 40 includes two third silicon oxide layers 26 and a second silicon oxide layer 28, a thickness of the second silicon oxide layer 28 is smaller than a thickness of each of the two third silicon oxide layers 26. A control gate CG covers and contacts the silicon oxide layer 40. A first source/drain doping region 34a and a second source/drain doping region 34b are respectively disposed at two sides of the control gate CG and in the active region AA within the memory unit region M. A first direction D1 points from the first source/drain doping region 34a to the second source/drain doping region 34b. A second direction D2 is parallel to a top surface of the silicon substrate 10 and perpendicular to the first direction D1. Along the second direction D2, the silicon oxide layer 40 has a cross section. The silicon oxide layer 40 shown in FIG. 8 is the cross section taken along line I-I' which is along the second direction D2 in FIG. 9. The cross section shows that the second silicon oxide layer 28 (which is thin comparing to the third silicon oxide layer 26) is sandwiched between the two third silicon oxide layers 26 (which is thick comparing to the second silicon oxide layer 28).

Moreover, the second silicon oxide layer 28 is only within the active region AA within the memory unit region M and does not cross the range of the control gate CG. The second silicon oxide layer 28 within the memory unit region M has two ends E which do not contact the two third silicon oxide layers 26, and the two ends E are parallel to the second direction D2. Furthermore, the second silicon oxide layer 28 does not overlap any shallow trench isolations 12.

Moreover, the control gate CG and the silicon oxide layer 40 overlap each other entirely; therefore only the position of the control gate CG is shown in FIG. 9. As shown in FIG. 9, the control gate CG and the silicon oxide layer 40 are both extend along the second direction D2, the control gate CG intersects with the shallow trench isolations 12, and the silicon oxide layer 40 intersects with the shallow trench isolations 12. According to a preferred embodiment of the present invention, a thickness of each of the third silicon oxide layers 26 is 1.5 to 5 times of a thickness of the second silicon oxide layer 28.

A transistor gate IOG is disposed on the silicon substrate 10 within the input output region IO. A second silicon oxide layer 28 is disposed between the transistor gate IOG and the silicon substrate 10. The second silicon oxide layer 28 within the input output region IO serves as a gate dielectric layer for an input output transistor. A thickness of the gate dielectric layer for the input output transistor is the same as a thickness of the second silicon oxide layer 28 within the memory unit region M. A material of making the gate dielectric layer for the input output transistor is the same as a material of making the second silicon oxide layer 28 within the memory unit region M. A high voltage transistor 38 is disposed on the silicon substrate 10 within the high voltage transistor region H. The high voltage transistor 38 includes a high voltage gate HVG and a first silicon oxide layer 22. The first silicon oxide layer 22 serves as a high voltage gate dielectric layer. A thickness of the high voltage gate dielectric layer of the high voltage transistor 38 is the same as a thickness of each of the third silicon oxide layers 26. A material of making the high voltage gate dielectric layer is the same as a material of making each of the third silicon oxide layers 26.

The formation of the shallow trench isolations includes several steps of etches and cleanings; therefore, a step high is formed between the active region and the shallow trench isolation. The silicon nitride layer covering the shallow trench isolation also conformally forms step high profiles due to the step high between the active region and the shallow trench isolation. In this case, electrons stored in the silicon nitride layer will leak from the step high profiles to the active region.

Therefore, a thickness of the middle of the topmost silicon oxide layer of the SONOS memory cell in the present invention is decreased. In this way, the topmost silicon oxide layer forms a U-shaped profile with a thin middle and two thick sides. This U-shaped profile makes electron field at the middle of the topmost silicon oxide layer higher; therefore, electrons will accumulate within the silicon nitride layer directly under the middle of the topmost silicon oxide layer (the second silicon oxide layer), and fewer electrons will accumulate at two sides of the silicon nitride layer. In this way, electrons will stay away from the step high profile of the silicon nitride layer, and current leakage can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a silicon-oxide-nitride-oxide-silicon (SONOS) memory cell structure, comprising:
providing a silicon substrate, wherein the silicon substrate is divided into a memory unit region, an input output region and a high voltage transistor region;
forming a tunnel silicon oxide layer and a silicon nitride layer covering the memory unit region;
forming a first silicon oxide layer covering and contacting the silicon nitride layer, the input output region and the high voltage transistor region;
removing the first silicon oxide layer within the input output region entirely and removing part of the first silicon oxide layer within the memory unit region to segment the first silicon oxide layer within the memory unit region into two third silicon oxide layers;
forming two second silicon oxide layers, wherein one of the two second silicon oxide layers is between the two third silicon oxide layers and another one of the two second silicon oxide layers is within the input output region; and
forming a control gate covering the one of the two second silicon oxide layers within the memory unit region and covering the two third silicon oxide layers, forming a high voltage gate covering the first silicon oxide layer within the high voltage transistor region, and forming a transistor gate covering the another one of the two second silicon oxide layers within the input output region.

2. The fabricating method of an SONOS memory cell structure of claim 1, wherein a thickness of the first silicon oxide layer is greater than a thickness of each of the two second silicon oxide layers.

3. The fabricating method of an SONOS memory cell structure of claim 2, wherein the thickness of the first silicon oxide layer is 1.5 to 5 times of the thickness of each of the two second silicon oxide layers.

4. The fabricating method of an SONOS memory cell structure of claim 1, wherein the first silicon oxide layer is formed by an in-situ steam generated process or an atomic layer deposition process.

5. The fabricating method of an SONOS memory cell structure of claim 1, wherein the two second silicon oxide layers are formed by an in-situ steam generated process or an atomic layer deposition process.

6. The fabricating method of an SONOS memory cell structure of claim 1, further comprising: after forming the control gate, forming a first source/drain doping region and a second source/drain doping region respectively disposed at two sides of the control gate and in the silicon substrate, wherein a first direction points from the first source/drain doping region to the second source/drain doping region, a second direction is parallel to a top surface of the silicon substrate and perpendicular to the first direction, along the second direction, the one of the two second silicon oxide layers within the memory unit region is sandwiched between the two third silicon oxide layers.

7. The fabricating method of an SONOS memory cell structure of claim 1, wherein the one of the two second silicon oxide layers within the memory unit region comprises two ends which do not contact the two third silicon oxide layers, and the two ends are parallel to the second direction.

8. The fabricating method of an SONOS memory cell structure of claim 1, further comprising:
- before forming the first silicon oxide layer, forming two pad oxide layers respectively covering the input output region and the high voltage transistor region and forming a top silicon oxide layer covering the silicon nitride layer; and
- before forming the first silicon oxide layer, removing the two pad oxide layers and the top silicon oxide layer.

* * * * *